United States Patent
Nam

(10) Patent No.: US 7,335,268 B2
(45) Date of Patent: Feb. 26, 2008

(54) INORGANIC COMPOUND FOR REMOVING POLYMERS IN SEMICONDUCTOR PROCESSES

(75) Inventor: Sang Woo Nam, Seoul (KR)

(73) Assignee: Dongbu Electronics Co., Ltd., Seoul (KR)

(*) Notice: Subject to any disclaimer, the term of this patent is extended or adjusted under 35 U.S.C. 154(b) by 323 days.

(21) Appl. No.: 10/750,248

(22) Filed: Dec. 31, 2003

(65) Prior Publication Data

US 2005/0085076 A1    Apr. 21, 2005

(30) Foreign Application Priority Data

Jul. 23, 2003    (KR)    ................. 10-2003-0050651

(51) Int. Cl.
*H01L 21/302* (2006.01)
(52) U.S. Cl. ............................. 134/3; 134/26; 510/175
(58) Field of Classification Search .................... None
See application file for complete search history.

(56) References Cited

U.S. PATENT DOCUMENTS

| | | | | |
|---|---|---|---|---|
| 5,489,557 A * | 2/1996 | Jolley | ......................... | 438/476 |
| 5,858,106 A * | 1/1999 | Ohmi et al. | ................... | 134/1 |
| 5,896,875 A * | 4/1999 | Yoneda | .................... | 134/102.3 |
| 5,950,645 A * | 9/1999 | Olesen et al. | ............... | 134/98.1 |
| 6,630,074 B1 * | 10/2003 | Rath et al. | ................. | 252/79.3 |
| 6,630,406 B2 * | 10/2003 | Waldfried et al. | .......... | 438/710 |
| 2001/0051128 A1 * | 12/2001 | Hoffman et al. | ............. | 423/470 |
| 2002/0033186 A1 * | 3/2002 | Verhaverbeke et al. | ....... | 134/26 |

FOREIGN PATENT DOCUMENTS

| EP | 0918081 | 5/1999 |
|---|---|---|
| JP | 3181264 | 4/2001 |

* cited by examiner

*Primary Examiner*—Gregory Webb
(74) *Attorney, Agent, or Firm*—Andrew D. Fortney

(57) ABSTRACT

An inorganic compound for removing polymers after a semiconductor etching process and related methods and apparatus are disclosed. An example compound includes DIW, $H_2SO_4$, $H_2O_2$ and HF. An example method for removing polymers generated during etching processes removes the polymers by using the example compound forms a protective oxide film on at least one of a metal line, a via hole and a pad open area by using $H_2O_2$, and protects the at least one the metal line, the via hole and the pad open area by the protective oxide film while removing the polymers by using HF. An apparatus for manufacturing the example compound includes a plurality of tanks in which DIW, $H_2SO_4$, $H_2O_2$ and HF are stored, respectively, a main tank for mixing DIW, $H_2SO_4$, $H_2O_2$ and HF supplied from the plurality of tanks through supplying tubes connected between the main tank and the plurality of tanks, flow control devices for controlling flow rates of DIW, $H_2SO_4$, $H_2O_2$ and HF, through the supplying tubes, and a pump for circulating a mixture of DIW, $H_2SO_4$, $H_2O_2$ and HF stored in the main tank.

12 Claims, 1 Drawing Sheet

INORGANIC COMPOUND FOR REMOVING POLYMERS IN SEMICONDUCTOR PROCESSES

FIELD OF THE DISCLOSURE

The present disclosure relates generally to semiconductor devices and, more particularly, to an inorganic compound for removing polymers after a semiconductor etching process.

BACKGROUND

In general, polymers are generated from a photoresist mask, during dry etching processes such as a metal line etching process, a via hole etching process and a pad oxide film etching process. In order to remove the polymers generated during the dry etching processes, amine-based chemicals and ammonium fluoride-based chemicals have been widely used as a solvent. After removing the polymers with the solvent, the solvent is treated with, e.g., isopropyl alcohol ("IPA") and methanol and eliminated by a rinsing process using deionized water ("DIW").

However, such a conventional polymer removing process is complicated, and the equipment needed to perform such a conventional polymer removing process is complex because the solvent for removing the polymers should be maintained at a high temperature.

In addition, the solvent is an expensive organic compound and the used solvent is typically gathered to be burned up in a separate waste treatment process, thereby increasing the maintenance costs associated therewith. Further, it takes an extended time to complete the rinsing process, so that a galvanic corrosion may be caused on semiconductor elements.

DETAILED DESCRIPTION

Figure 1:
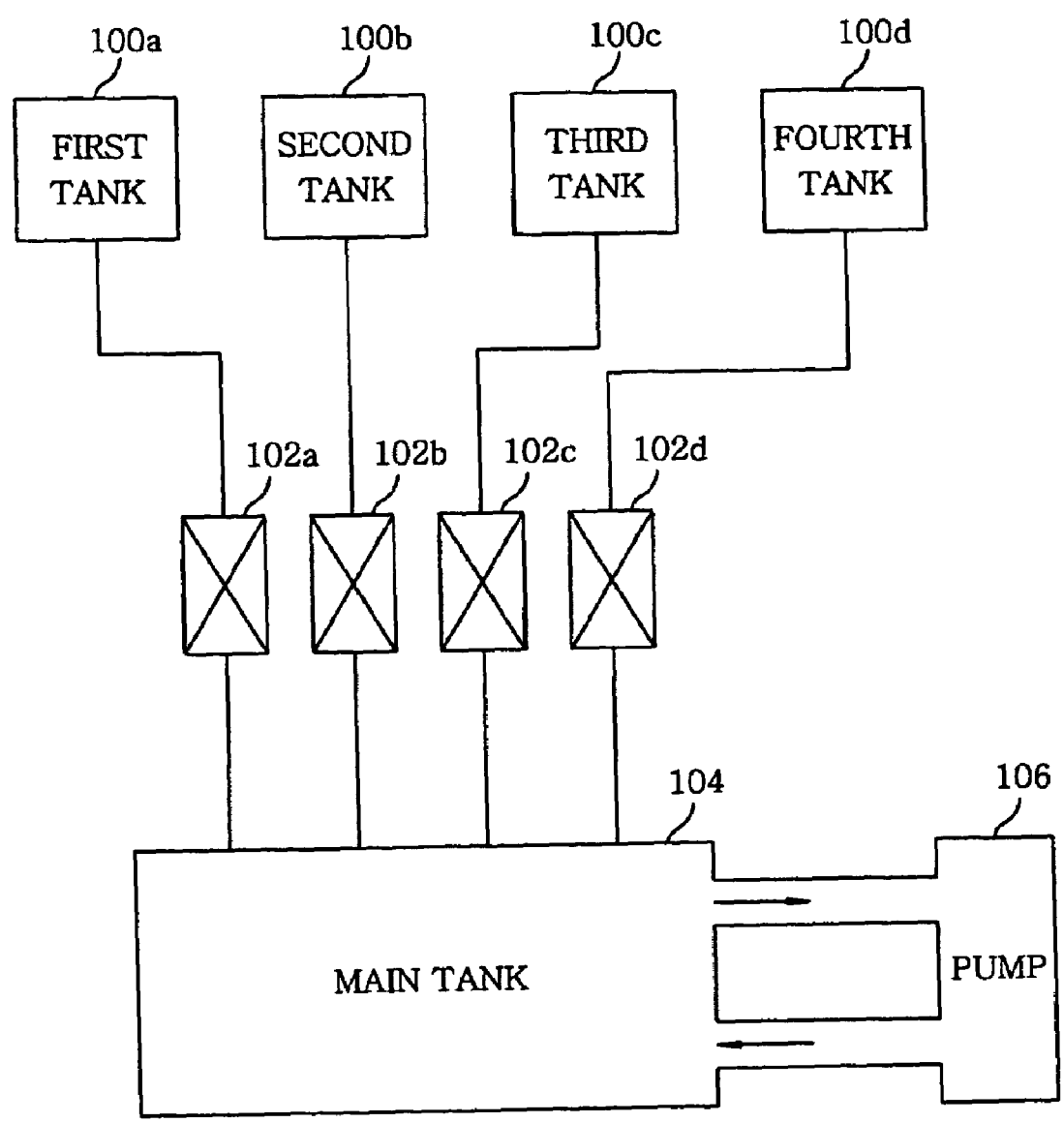
FIG. 1 is a block diagram illustrating an example apparatus for manufacturing a compound for removing polymers.

In one example embodiment, there is provided a compound for removing polymers generated during etching process, including DIW, $H_2SO_4$, $H_2O_2$ and HF, which are inorganic chemicals.

In another example, there is provided a method for removing polymers generated during etching processes, including removing the polymers by using an inorganic compound including DIW, $H_2SO_4$, $H_2O_2$ and HF, forming a protective oxide film on a metal line, a via hole or a pad open area by using $H_2O_2$, and protecting the metal line, the via hole or the pad open area by the protective oxide film while removing the polymers by using HF.

In still another example, there is provided an apparatus for manufacturing a compound for removing polymers generated during etching processes includes tanks in which DIW, $H_2SO_4$, $H_2O_2$ and HF are stored, respectively, a main tank for mixing DIW, $H_2SO_4$, $H_2O_2$ and HF supplied from the respective tanks through supplying tubes respectively connected between the main tank and the tanks, flow control devices for controlling flow rates of DIW, $H_2SO_4$, $H_2O_2$ and HF, which are respectively installed to the supplying tubes, and a pump for circulating a mixture of DIW, $H_2SO_4$, $H_2O_2$ and HF stored in the main tank in order to make the mixture uniform.

As shown in FIG. 1, an example apparatus for manufacturing an inorganic compound for removing polymers includes a first, a second, a third and a fourth tank 100a, 100b, 100c and 100d in which DIW, $H_2SO_4$, $H_2O_2$ and HF are stored, respectively, a main tank 104 for mixing DIW, $H_2SO_4$, $H_2O_2$ and HF supplied through supplying tubes connected with the first, the second, the third and the fourth tank 100a, 100b, 100c and 100d, respectively, flow control devices 102a, 102b, 102c and 102d installed to the supplying tubes for controlling flow rates of DIW, $H_2SO_4$, $H_2O_2$ and HF supplied to the main tank 104, respectively, and a pump 106 for circulating the mixture of DIW, $H_2SO_4$, $H_2O_2$ and HF to be uniformly mixed.

The compound produced by such an apparatus is used to remove polymers generated while a metal line, a via hole, a pad open area and the like are formed by an etching process using a photoresist as a mask. Further, the compound serves to remove the photoresist residual.

The polymer removing compound may be manufactured using the example method described below.

DIW, $H_2SO_4$, $H_2O_2$ and HF are supplied to the main tank 104 by controlling the respective flow control devices 102a, 102b, 102c and 102d of the respective supplying tubes connected between each of the first, the second, the third and the fourth tank 100a, 100b, 100c and 100d and the main tank 104. DIW supplied from the first tank 100a to the main tank occupies by volume about 70.5% to about 80.5%, preferably 75.5%, of the total volume of DIW, $H_2SO_4$, $H_2O_2$ and HF being supplied to the main tank 104. At this time, the volume of DIW is controlled by the flow control device 102a installed to the supplying tube connected between the first tank 100a and the main tank 104.

$H_2SO_4$ supplied from the second tank 100b to the main tank occupies by volume about 6.5% to about 8.5%, preferably 7.5%, of the total volume of DIW, $H_2SO_4$, $H_2O_2$ and HF being supplied to the main tank 104. At this time, the volume of $H_2SO_4$ is controlled by the flow control device 102b installed to the supplying tube connected between the second tank 100b and the main tank 104.

$H_2O_2$ supplied from the third tank 100c to the main tank occupies by volume about 15% to about 19%, preferably 17%, of the total volume of DIW, $H_2SO_4$, $H_2O_2$ and HF being supplied to the main tank 104. At this time, the volume of $H_2O_2$ is controlled by the flow control device 102c installed to the supplying tube connected between the third tank 100c and the main tank 104.

HF provided from the fourth tank 100d to the main tank occupies by volume about 50 PPM to about 150 PPM. At this time, the volume of HF is controlled by the flow control device 102d installed to the supplying tube connected between the fourth tank 100d and the main tank 104.

By such processes, by volume, DIW of about 70.5% to about 80.5%, $H_2SO_4$ of about 6.5% to about 8.5%, $H_2O_2$ of about 15% to about 19% and HF of about 50 PPM to about 150 PPM are stored in the main tank 104. DIW, $H_2SO_4$, $H_2O_2$ and HF are circulated by the pump 106 to be uniformly mixed.

The compound produced by such processes can be used to remove polymers generated during the etching processes. Further, the compound also serves to remove the photoresist residual. In particular, $H_2SO_4$ and $H_2O_2$ of the compound serve to remove the photoresist residual. $H_2O_2$ also forms a protective oxide film on the metal line, the via hole and the pad open area to protect them from corrosion while HF removes polymers.

The compound for removing polymers is made of the inorganic chemicals, such as DIW, $H_2SO_4$, $H_2O_2$ and HF, thereby shortening the time period of a rinsing process after the removal of polymers.

In accordance with the example methods described herein, the polymers are removed by using the inorganic compound, thereby shortening the time period of the rinsing process after the removal of polymers and preventing any galvanic corrosion of the semiconductor elements, e.g., the metal line, a miss-aligned plug, the pad open area due to the shortened rinsing process time. Further, the compound is made of the cheaper inorganic chemicals, thereby decreasing the maintenance cost.

Although certain methods and apparatus have been described herein, the scope of coverage of this patent is not limited thereto. To the contrary, this patent covers all embodiments fairly falling within the scope of the appended claims either literally or under the doctrine of equivalents.

What is claimed is:

1. A method for removing polymers generated during an etching process, comprising the steps of:
   removing the polymers from a metal line, a via hole, or a pad open area by using an inorganic compound including DIW, $H_2SO_4$, $H_2O_2$ and HF;
   forming a protective oxide film on the metal line, the via hole or the pad open area by using $H_2O_2$; and
   protecting the metal line, the via hole or the pad open area by the protective oxide film while removing the polymers by using HF,
   wherein DIW occupies by volume about 70.5% to about 80.5% of the total volume of DIW, $H_2SO_4$ $H_2O_2$ and HF, $H_2SO_4$ occupies by volume about 6.5% to about 8.5% of the total volume of DIW, $H_2SO_4$, $H_2O_2$ and HF, $H_2O_2$ occupies by volume about 15% to about 19% of the total volume of DIW, $H_2SO_4$, $H_2O_2$ and HF, and HF occupies by volume a range of greater than 100 PPM and approximately less than or equal to 150 PPM of the total volume of DIW, $H_2SO_4$, $H_2O_2$ and HF, and wherein the total volume % of DIW, $H_2SO_4$, $H_2O_2$ and HF is about 100%.

2. The method of claim 1, wherein DIW occupies by volume about 75.5% of the total volume of DIW, $H_2SO_4$, $H_2O_2$ and HF.

3. The method of claim 1, wherein $H_2SO_4$ occupies by volume about 7.5% of the total volume of DIW, $H_2SO_4$ $H_2O_2$ and HF.

4. The method of claim 1, wherein $H_2O_2$ occupies by volume about 17% of the total volume of DIW, $H_2SO_4$, $H_2O_2$ and HF.

5. The method of claim 1, further comprising storing the DIW, the $H_2SO_4$, the $H_2O_2$ and the HF in separate tanks prior to application to the semiconductor device feature.

6. The method of claim 5, further comprising mixing the DIW, the $H_2SO_4$, the $H_2O_2$ and the HF in a common tank to form the inorganic compound prior to application to the semiconductor device feature.

7. The method of claim 6, further comprising delivering the DIW, the $H_2SO_4$, the $H_2O_2$ and the HF to the common tank from the separate tanks via supplying tubes.

8. The method of claim 7, wherein the supplying tubes comprise flow control devices that regulate the flow of the DIW, the $H_2SO_4$, the $H_2O_2$ and the HF into the common tank.

9. The method of claim 8, wherein the flow control devices deliver the DIW, the $H_2SO_4$, the $H_2O_2$ and the HF at individually varied rates.

10. The method of claim 9, wherein the common tank comprises a pump that circulates and uniformly mixes the the DIW, the $H_2SO_4$, the $H_2O_2$ and the HF in the common tank.

11. The method of claim 1, further comprising forming the metal line, the via hole, or the pad open area by an etching process using a photoresist as a mask.

12. The method of claim 11, wherein the polymers comprise residual photoresist material.

* * * * *